United States Patent
Cunningham et al.

(10) Patent No.: US 7,141,743 B2
(45) Date of Patent: Nov. 28, 2006

(54) METHOD AND APPARATUS FOR PROTECTING A CIRCUIT ASSEMBLY FROM ELECTROSTATIC DISCHARGE

(75) Inventors: Randy M. Cunningham, Roseville, CA (US); David J. Pommerenke, Rolla, MO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 69 days.

(21) Appl. No.: 10/439,730

(22) Filed: May 16, 2003

(65) Prior Publication Data

US 2004/0226732 A1    Nov. 18, 2004

(51) Int. Cl.
*H05K 5/00* (2006.01)
*H01H 3/00* (2006.01)

(52) U.S. Cl. .................. 174/520; 200/329; 200/333; 200/341

(58) Field of Classification Search .............. 174/35 R, 174/35 CG; 361/312, 320, 816, 818; 439/103, 439/186, 140; 200/329, 333, 341
See application file for complete search history.

(56) References Cited

U.S. PATENT DOCUMENTS

| | | | | |
|---|---|---|---|---|
| 4,809,126 A | * | 2/1989 | Burkman et al. | 361/212 |
| 5,193,047 A | * | 3/1993 | Barratt et al. | 361/212 |
| 5,401,926 A | * | 3/1995 | Aoyama et al. | 200/305 |
| 6,129,440 A | * | 10/2000 | Reynolds | 362/95 |
| 6,215,602 B1 | | 4/2001 | Kubo et al. | |
| 6,264,376 B1 | | 7/2001 | Savage, Jr. | |
| 6,758,690 B1 | * | 7/2004 | Yu et al. | 439/140 |
| 2003/0089587 A1 | * | 5/2003 | Mayo et al. | 200/329 |

FOREIGN PATENT DOCUMENTS

| | | |
|---|---|---|
| CA | 1297206 | 3/1992 |
| DE | 4419667 A1 | 12/1995 |

* cited by examiner

*Primary Examiner*—Hung V. Ngo

(57) ABSTRACT

In an embodiment, a method for changing a direction of an electrostatic discharge includes: providing a structure having a path capable of passing an electrostatic discharge, and changing by over about 90° (ninety degrees) a direction of an electrostatic discharge passing through the path. In another embodiment, a case assembly includes: a case member; and a light pipe assembly coupled to the case member. The light pipe assembly includes a body, a leg member coupled to and depending from the body, and a head supported by the body. In an embodiment, a case assembly includes a switch actuator assembly coupled to the case member and capable of activating when pushed a switch supported by a circuit board.

35 Claims, 22 Drawing Sheets

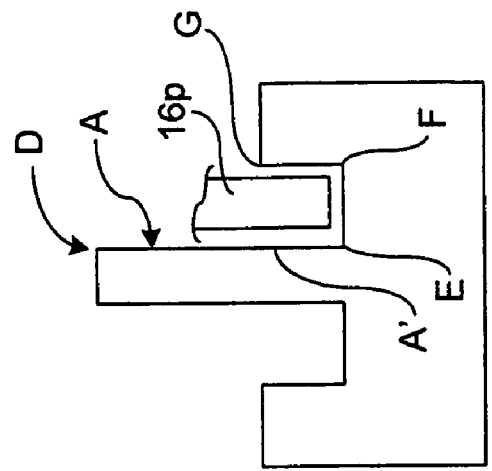
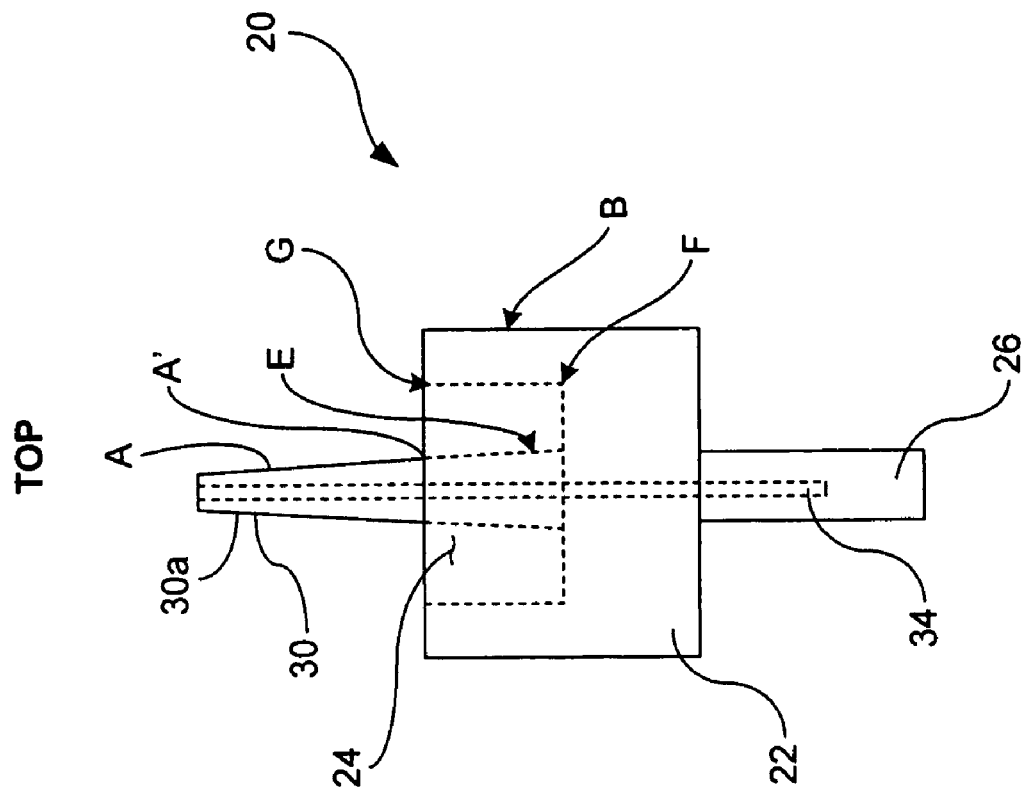
FIG. 3B
FIG. 3A

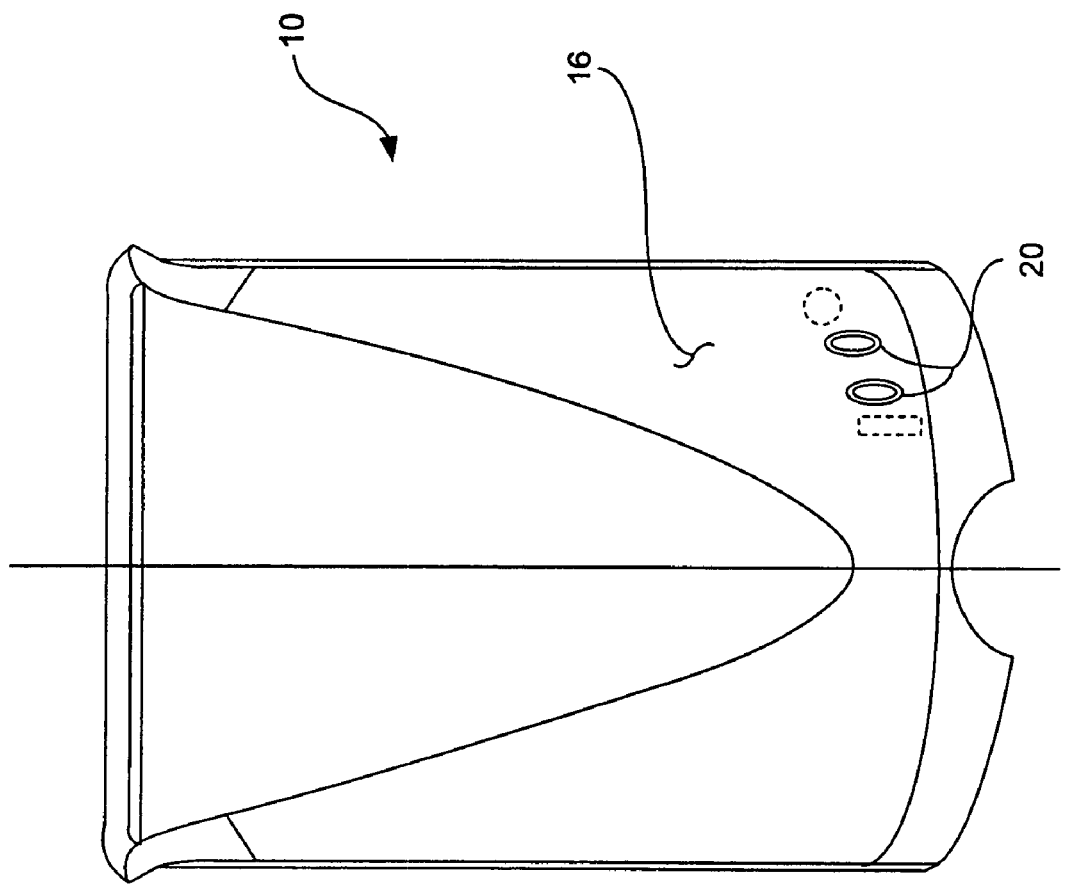

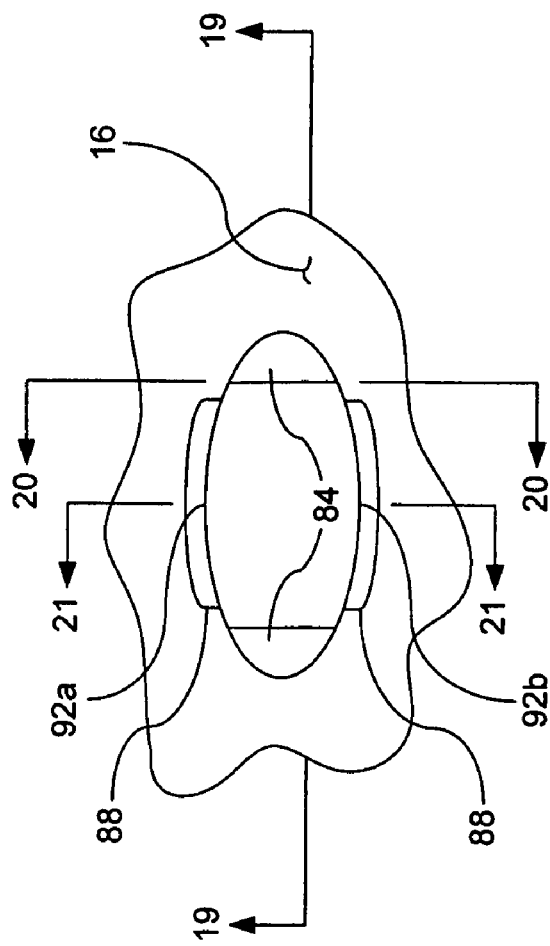
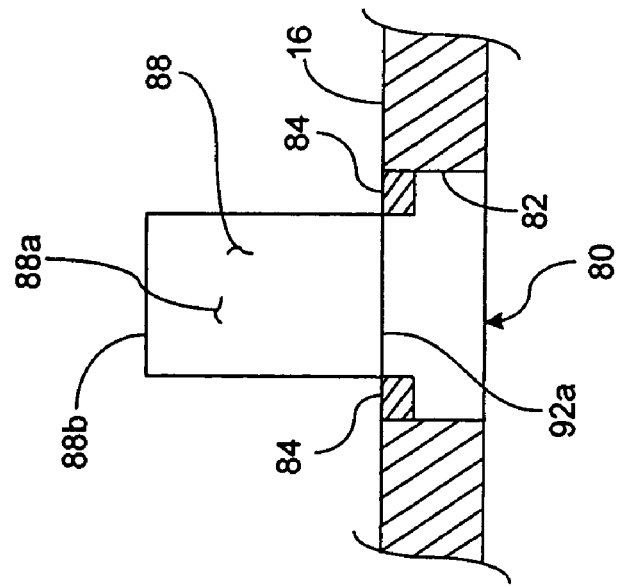
FIG. 18
Conventional Art
FIG. 19
Conventional Art

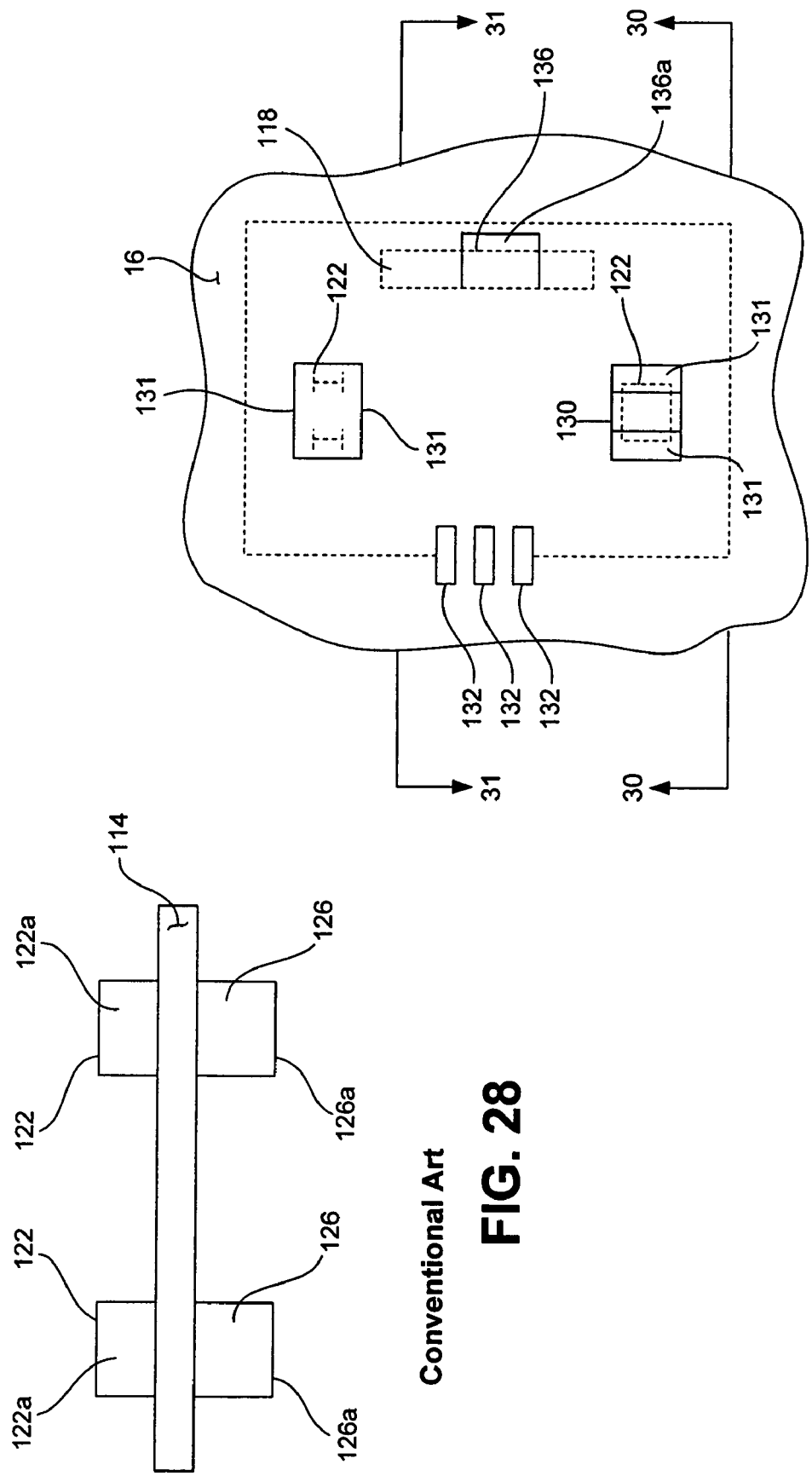

METHOD AND APPARATUS FOR PROTECTING A CIRCUIT ASSEMBLY FROM ELECTROSTATIC DISCHARGE

FIELD OF INVENTION

Embodiments of the present invention broadly relate to circuit assemblies. More specifically, embodiments of the present invention provide for a method and assembly for protecting circuit assemblies, such as printed circuit assemblies (PCA) from an electro-static discharge (ESD).

BACKGROUND ART

Electrical static discharge is electrical discharge of static electricity that builds up on personnel or equipment, generated by interaction of dissimilar materials. Static sensitive devices, especially those of a printed circuit assembly (PCA), may be damaged or disturbed when they come into close proximity with electrostatic charged objects. This is also true when the static sensitive devices are packaged in a container (e.g., a plastic case) for shipping purposes or other purposes and the outside of the container comes in contact with electrostatic charged objects. Cases or containers having a seam or path, such as between a light pipe, or a switch or another actuator, and the case or container, are especially troublesome for static sensitive devices since the seam or path provides a conduit for electrostatic electricity to the static sensitive devices.

There are a number of conventional solutions to prevent damage to static sensitive devices that are proximately disposed to a light pipe. One method for increasing electrostatic discharge immunity involves increasing the linear distance between the electrostatic discharge "charged" object and the static sensitive device on a printed circuit assembly. The linear distance is increased by adding an additional flat surface of plastic to the light pipe such that the new surface is oriented perpendicular to the axis of the light pipe. As the size/diameter of the flat surface is increased and the corresponding linear distance for a discharge from an electrostatic discharge device to travel is increased, the voltage needed to breakdown between the charged object and the printed circuit assembly is increased. The primary disadvantage in the use of a wide flat surface around a light pipe to increase the electrostatic discharge immunity is the requirement for a large space around the light pipe or actuator. For small products and products with a light pipe located in a corner or adjacent to another mechanical or electrical component, there may not be adequate clearance around the light pipe to add a large enough flat surface to provide a meaningful increase in electrostatic discharge immunity protection.

Another method of increasing electrostatic discharge immunity involves removing or reducing the "air-gap" between the light pipe and the product case. The space between the light pipe and the product case may be removed/reduced by any one of the following three options: (i) glue may be applied to the seam between the product case and the light pipe at the time of assembly; (ii)the plastic of the light pipe maybe attached via ultra-sonic welding causing the plastic of the product's case to melt together with the plastic of the light pipe; (iii) the light pipe and the plastic product case may be manufactured to precision tolerances and assembled to obtain what is regarded as a non-ionizable air gap of less than about 10 um. The primary disadvantage of these air-gap reduction alternatives is centered on increased material and labor costs. More specifically, the glue alternative approach increases the manufacturing cost for both labor and material in addition to loosing the flexibility of rework and decreased cosmetic yields. The ultra-sonic welding approach increases labor cost by requiring complex machines and training and additionally reduces flexibility of reworking products if required. The precision-tolerance approach which reduces the air-gap to less than 10 um results in substantial increased cost in manufacturing by injection molding, as well as the labor to manufacture the parts.

The options mentioned above fail for parts that need to be moving. An example of a situation in which a moving member passes through the structural member is a PCB-mounted switch having a plastic rod, as actuator element, that extends through the plastic enclosure.

In this case, neither glue nor welding can be applied. Creating and maintaining a very narrow gap under use a gap between the moving actuator and the plastic enclosure is very difficult, such that other solutions must be sought.

SUMMARY OF EMBODIMENTS OF THE INVENTION

Embodiments of the present invention provide a method for changing a direction of an electrostatic discharge including: providing a structure having a path capable of passing an electrostatic discharge, and changing by over about 90° (ninety degrees) a direction of an electrostatic discharge passing through the path. The method may additionally include: changing the direction of the electrostatic discharge away from a circuit board. The method may further additionally include: increasing a breakdown voltage by changing a field structure of the electrostatic discharge. In an embodiment of the invention, the method additionally includes: disposing a device in proximity to the path for changing the direction of the electrostatic discharge (e.g., such as away from a circuit board). In another embodiment of the invention, the device may change the direction of the electrostatic discharge approximately 180 degrees. The device may include: a light pipe assembly, such as one having a bore for increasing a breakdown voltage by changing a field structure, and a recess for changing the direction of the electrostatic discharge. The bore may extend through a head, through a body, and terminates in a leg depending from the body. Whenever the word "resisting" is mentioned herein, it is intended to mean "resisting to a spark breakdown," unless otherwise indicated.

Embodiments of the present invention further provide a case assembly including: a case member, and a light pipe assembly coupled to the case member and capable of changing a direction of an electrostatic discharge. The case assembly may additionally include: a circuit board having electrostatic sensitive devices that are protected by the light pipe assembly from an electrostatic discharge.

Embodiments of the present invention also provide a light pipe assembly including: a body, a leg member coupled to and depending from the body, and a head supported by the body. The head may be a rectangular-shaped member having downwardly flanging sides. The body includes a structure defining a recess which may support the head. The light pipe assembly may additionally include: a bore extending into or through the head, into or through the body, and into and terminating in the leg. The bore may have a length which is generally greater than about 50% but less than 100% of a distance extending from the top of the head to the bottom of the leg.

Further embodiments of the present invention provide a case assembly including: a case member, and a switch actuator assembly coupled to the case member and capable of changing a direction of an electrostatic discharge. The case assembly may additionally include: a circuit board having a switch, or any other member, which is to be actuated by the switch actuator assembly and is to be protected by the switch actuator assembly from an electrostatic discharge.

These provisions together with the various ancillary provisions and features which will become apparent to those artisans possessing skill in the art as the following description proceeds are attained by devices, assemblies, systems and methods of embodiments of the present invention, various embodiments thereof being shown with reference to the accompanying drawings, by way of example only, wherein:

BRIEF DESCRIPTION OF THE DRAWINGS

FIG. 3A is a front elevational view taken in direction of the arrows and along the plane of line 3—3 in FIG. 2.

FIG. 3B is a side elevational view showing a plastic tab or the like in a recess of the cup-shaped member for blocking a jump or a spark.

FIG. 10 is a top plan view of a conventional art case member and a conventional art light pipe assembly.

FIG. 18 is a bottom plan view of the opening in a case member illustrated in FIG. 16 where the light pipe assembly of FIGS. 12–15 may be disposed and held with engagers or retainers.

FIG. 19 is a vertical sectional view taken in direction of the arrows and along the plane of line 19—19 in FIG. 18.

FIG. 28 is a side elevational view taken in direction of the arrows and along the plane of line 28—28 in FIG. 25.

FIG. 29 is a top plan view of a portion of a case member engaging and retaining the light pipe assembly of FIGS. 25–27, illustrated in dashed lines.

DETAILED DESCRIPTION OF EMBODIMENTS OF THE INVENTION

Figure 1A:
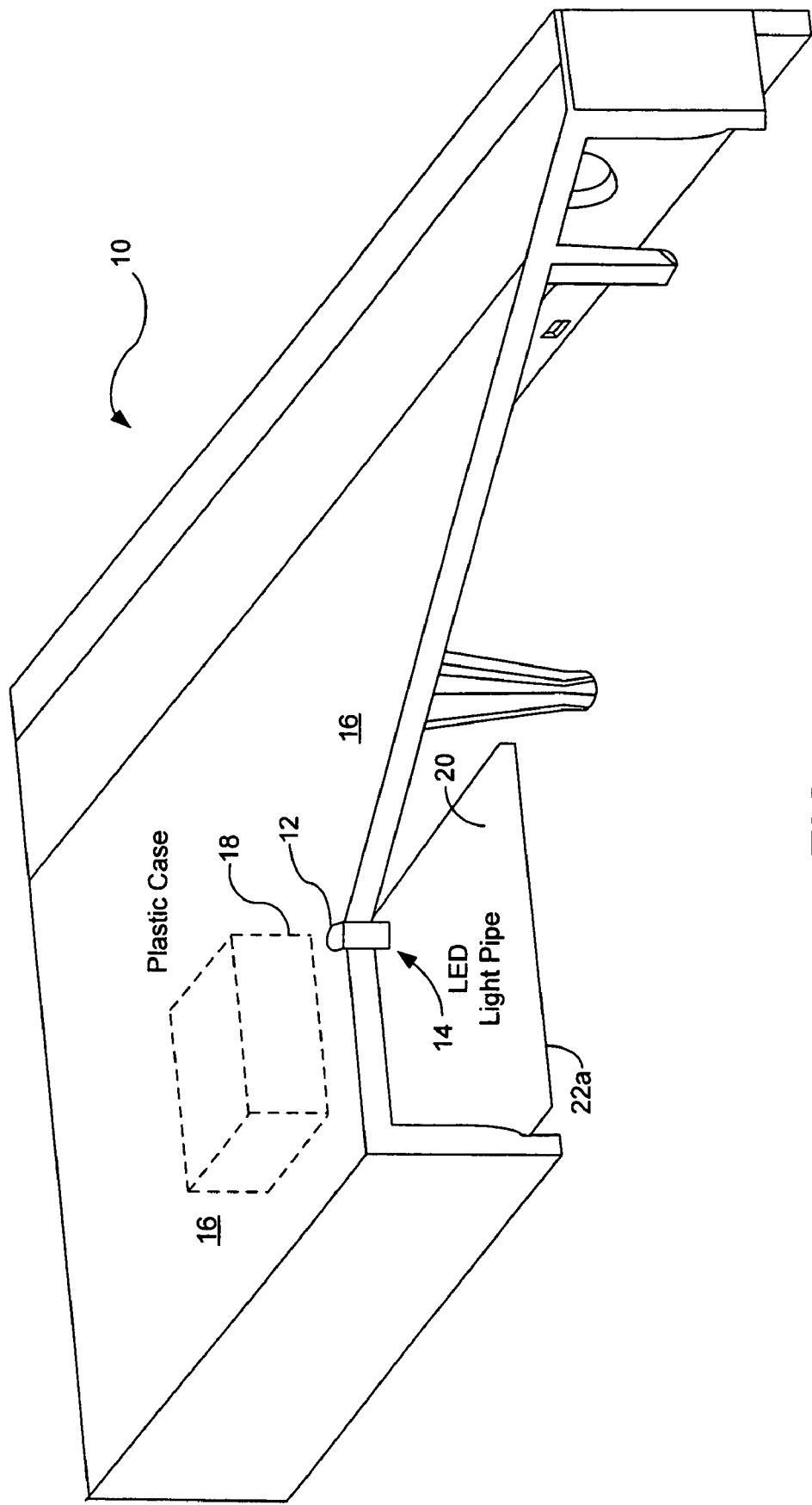
FIG. 1A is a segmented perspective view of a circuit board assembly protected by a plastic cover with a seam.
Figure 1B:
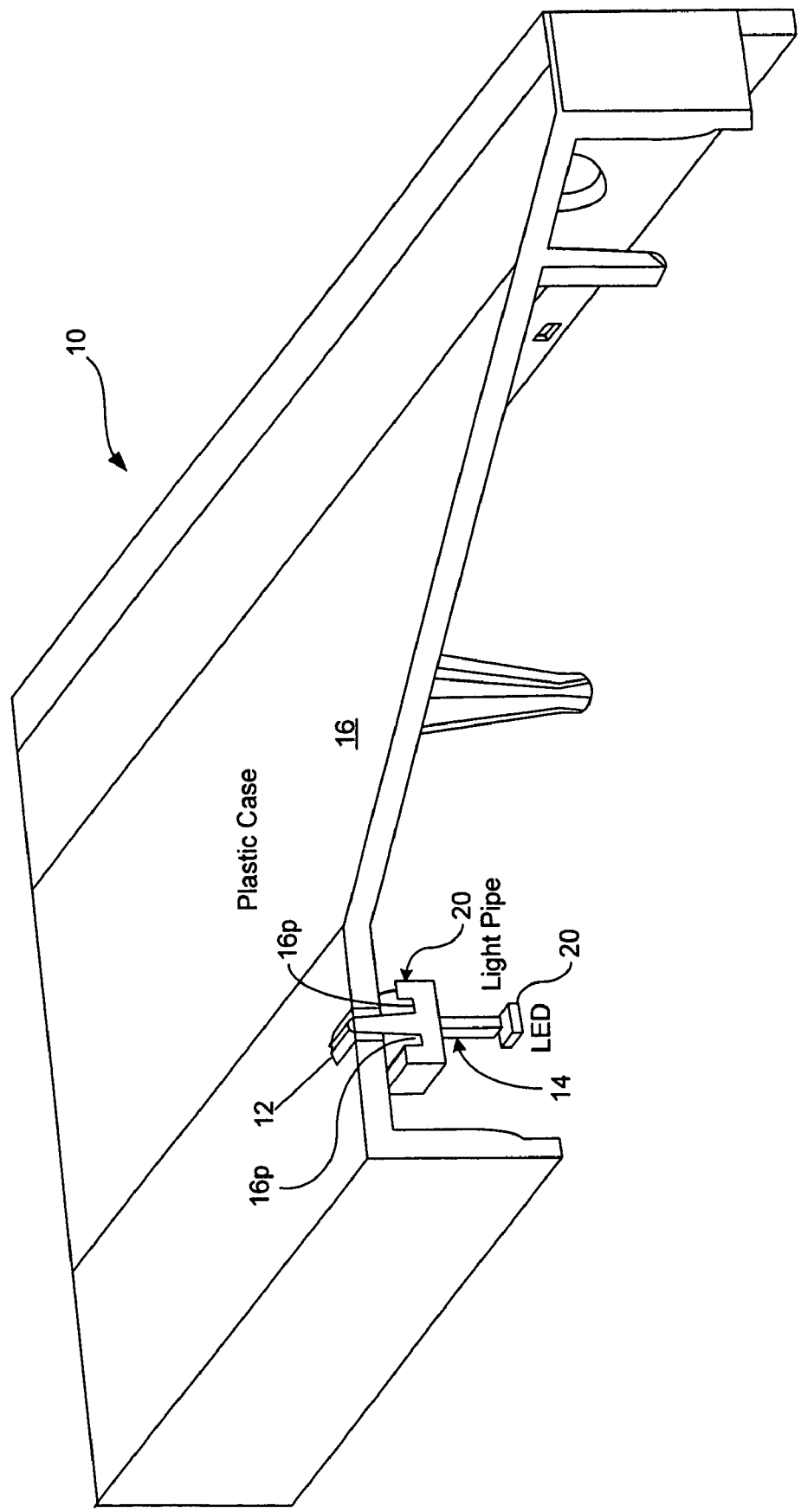
FIG. 1B is a perspective view of a plastic cover having an embodiment of the light pipe assembly.
Figure 2:
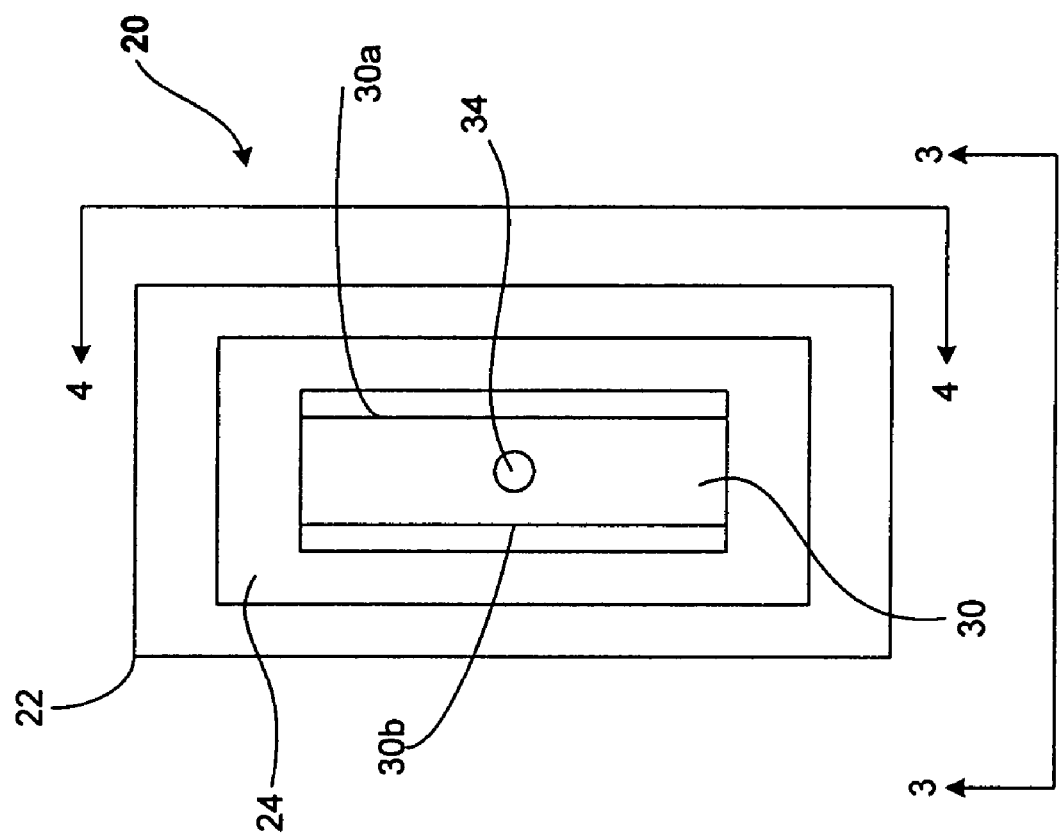
FIG. 2 is a top plan view of an embodiment of the light pipe assembly.

Referring in detail now to the drawings for various embodiments of the present invention, there is seen in FIG. 1A a case assembly, generally illustrated as 10. The case assembly 10 includes an ESD path 12 (e.g., a seam 12) between a light pipe 14 and a product case 16. The light pipe 14 is directly exposed to a light source (e.g., an LED) for providing a conduit for light to be seen external to the case assembly 10. When an electrostatic charged object 18 comes in close proximity to the seam 12 between the light pipe 14 and the product case 16, static sensitive devices, such as static sensitive device 20, on a printed circuit assembly (PCA) 22a may be damaged from an electrostatic discharge emanating from the electrostatic charged object 18 and passing through the seam 12. In FIG. 1B there is seen the seam 12 between an embodiment of the light pipe 14 and the product case 16. FIG. 1B further illustrates a feature (i.e., a plastic feature 16*p* as also illustrated in FIG. 3B) contained in or accompanying the case 16 to provide material(s) to "fill/displace" space or air (space or recess 24) within a cup-shaped section (e.g., body 22) of an embodiment of the light pipe assembly. The plastic feature 16*p* may be a tab or the like extending down from and connected to the product case 16.

The driving force for an electrical breakdown which causes an electrostatic discharge is the electrical field. In some cases and as for embodiments of the present invention, it is caused by the potential difference between the printed circuit assembly 22*a* and an object (e.g. electrostatic charged object) external to the printed circuit assembly 22*a*. The electric field will accelerate charge carriers. If there is sufficient energy to ionize further charge carriers, a breakdown may occur. The voltages needed to breakdown air, providing that the spark path is parallel to the driving electric field, are much less than the voltages needed to breakdown most plastic. A typical design at a plastic interface has to typically use a linear distance of about 1.5 mm/KV below 10 KV and 1 mm/KV above 10 KV abut less than 30 KV to prevent electrostatic breakdown through the gap between plastic parts, if no preventive action is taken in accordance with embodiments of the present invention. Non-porous plastic will breakdown at field strengths above 100 KV/mm or at field strengths that are at an order of magnitude larger than the air breakdown field strengths.

In a spark charge, carriers are created due to collision, photo-ionization, detachments and other processes. The resulting charge carriers can be grouped into electrons and ions. The ions are predominantly positive ions, but can be negative if, by way of example, an electron attaches to a molecule, such as a water molecule. Due to the difference in weight, it is substantially easier to accelerate the lighter electrons to energies which are sufficient to cause further ionization on impact. Thus, the electrons dominate the electrical breakdown process in its initial stages.

Figure 5:
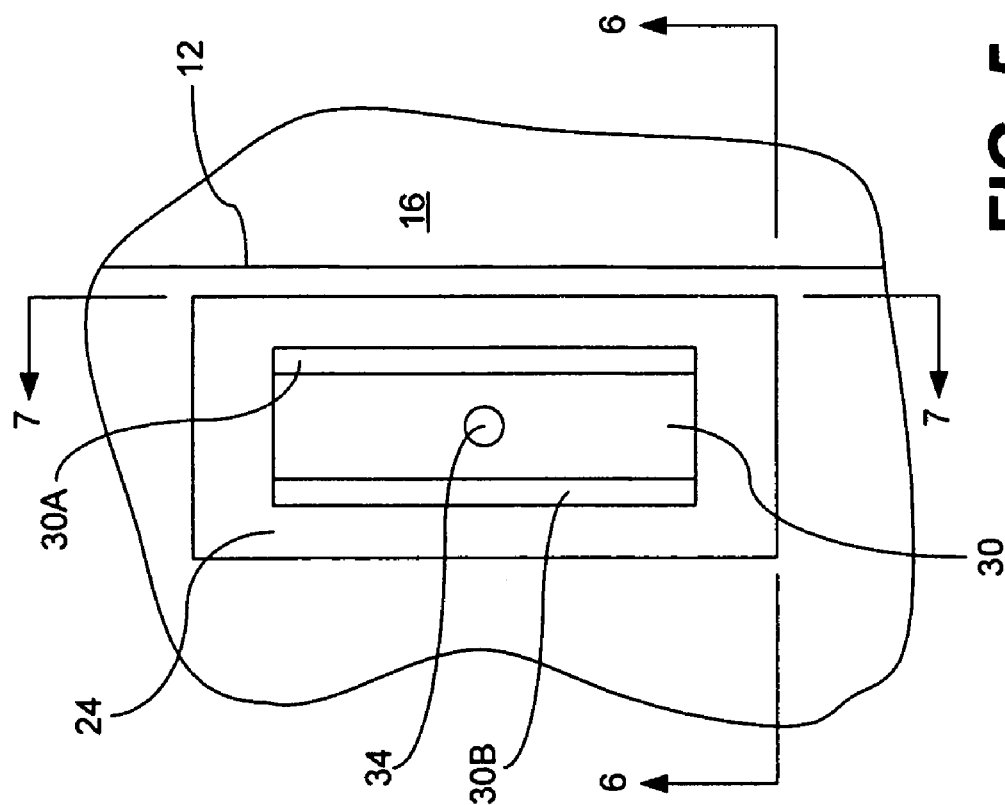
FIG. 5 is a top plan view of an embodiment of the light pipe assembly coupled to a case member.
Figure 4:
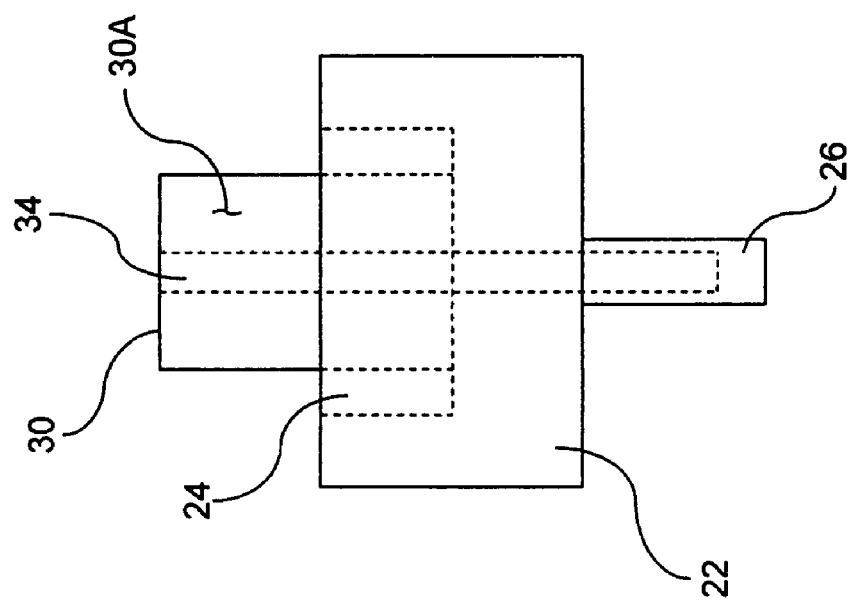
FIG. 4 is a front elevational view taken in direction of the arrows and along the plane of line 4—4 in FIG. 2.
Figure 6B:
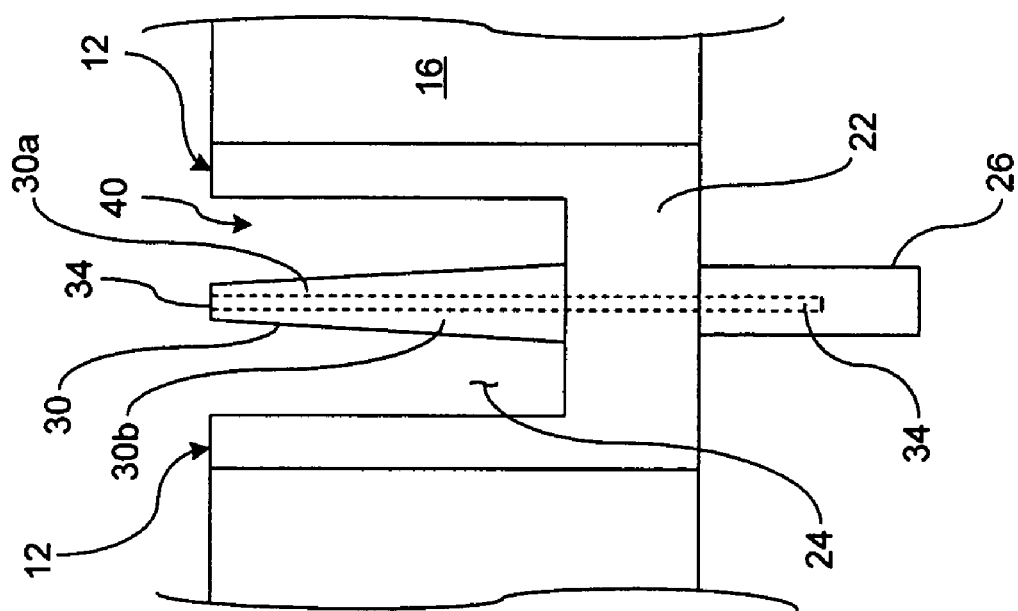
FIG. 6B is the embodiment of the light pipe assembly of FIG. 6A coupled to the case member in a different manner.
Figure 6A:
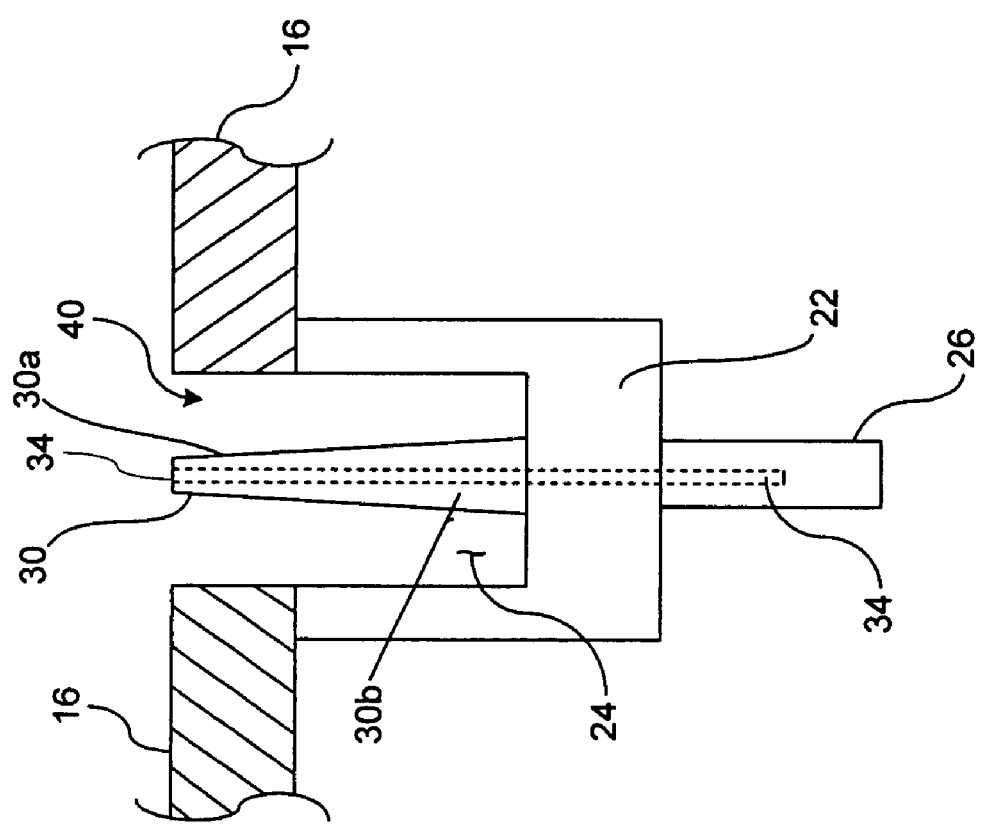
FIG. 6A is a front elevational view taken in direction of the arrows and along the plane of line 6—6 in FIG. 5.
Figure 7:
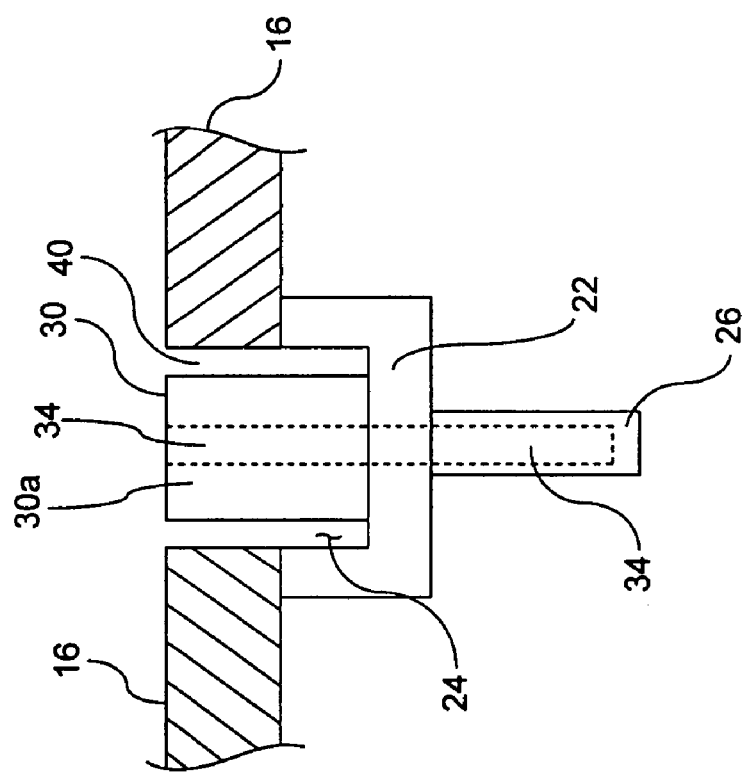
FIG. 7 is a front elevational view taken in direction of the arrows and along the plane of line 7—7 in FIG. 5.

Referring in detail now to FIGS. 2–9B, there is seen a light pipe assembly 20 for embodiments of the present invention. The light pipe assembly 20 may be coupled to and/or positioned against the product case 16 in any suitable manner, such as illustrated in FIGS. 5–7. The light pipe assembly 20 comprises a body 22 having a recess 24. The body 22 may be defined by a generally cup-shaped structure. As will be further explained hereinafter, the recess 24 provides a structure for changing direction of an electrostatic discharge, such as one emanating from or caused by electrostatic charged object 18. The light pipe assembly 20 additionally includes a depending leg 26 bound to the body 22 and a generally projecting head 30. The head 30 may be of any suitable geometric configuration, such as a generally rectangular configured member downwardly flanging (or tapering outwardly) sides 30*a* and 30*b*, which defines a trapezoidal member. For the embodiment of the invention illustrated in FIGS. 2–7, a bore 34 extends through the projecting head 30, through the body 22, and into and terminating in the depending leg 26. The bore 34 will change a field structure, due to charges accumulated in the bottom of the bore 34, in such a way that the outside path (through the gap) will resist breakdown up an increased voltage. For the embodiment of the invention in FIG. 8, there is no bore 34 extending into or through the head 30, the body 22, or the leg 26. Thus, embodiments of the invention provide the following two features: (1) a feature causing change of direction in charged particle's path so as to cause the particle to have to move in a direction opposing the field that initiated the charged particles initial movement; and (2) a feature causing a reduction in field strength due to trapping or catching charged particles in a dead end path (e.g., the end of bore 34). Light from a suitable source (e.g., LED) may pass through the leg 26 and the head 30 including the body 22.

Figure 8A:
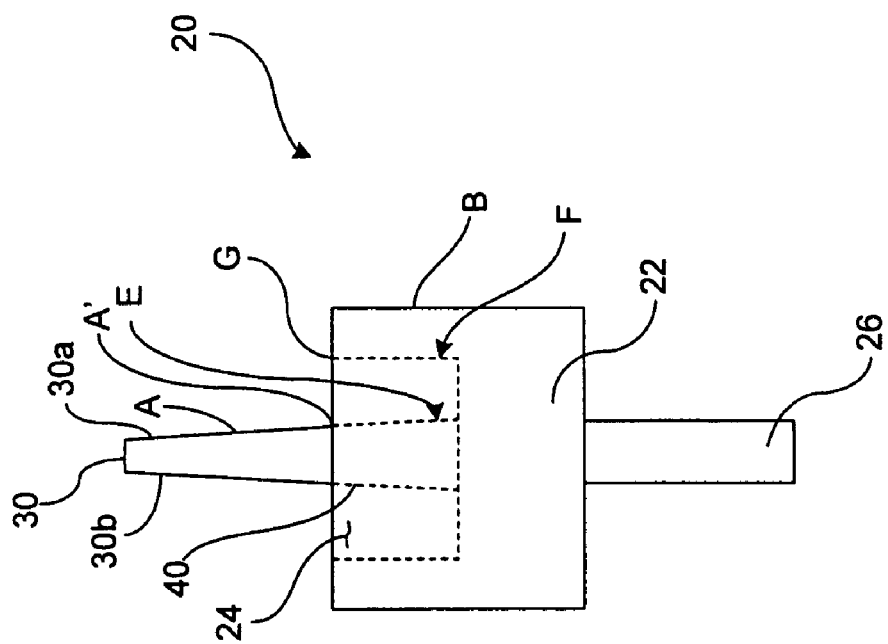
FIG. 8A is a front elevational view of another embodiment of the light pipe assembly.
Figure 8B:
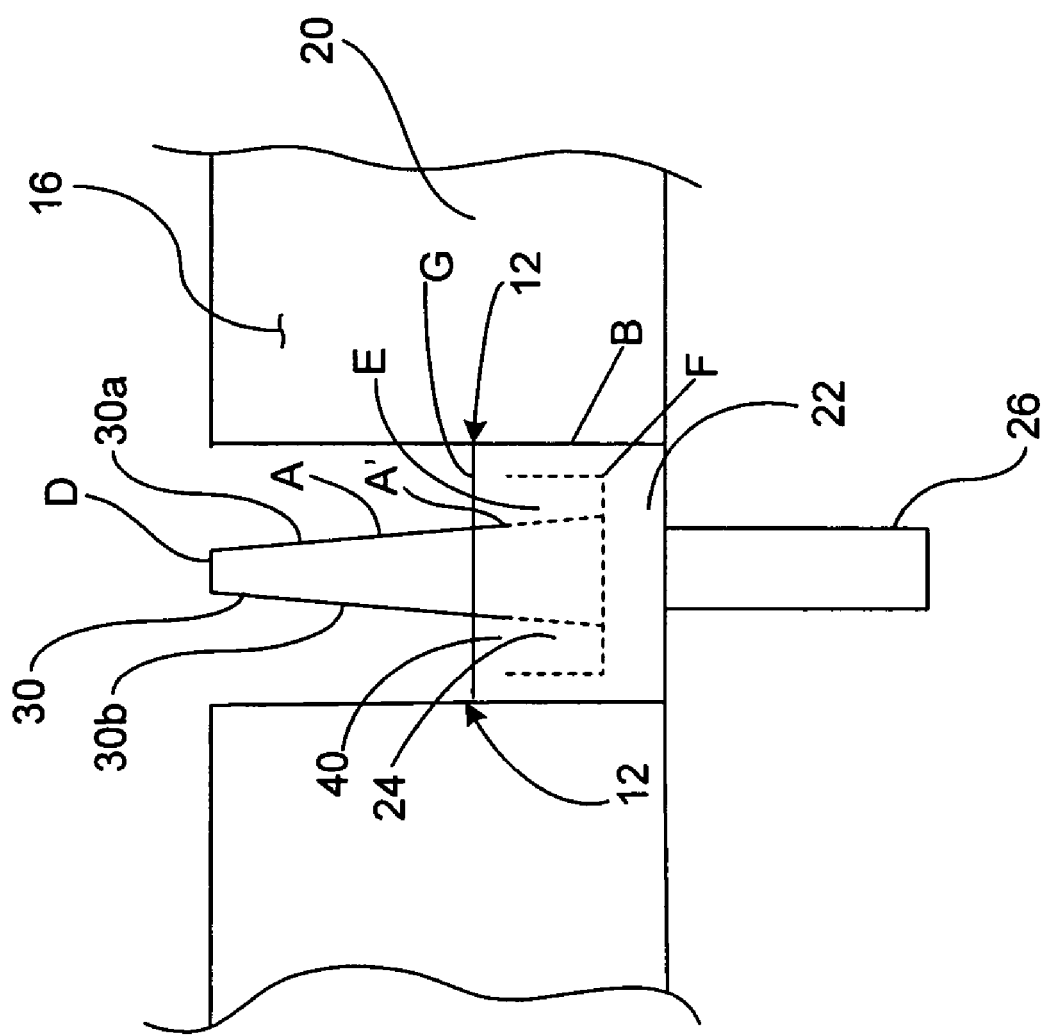
FIG. 8B is the embodiment of the light pipe assembly of FIG. 8A coupled to a case member.

In the geometric configuration for the light path assembly 20 illustrated in FIGS. 6 and 8, a path (e.g., a path of least resistance) that an electrostatic discharge may take is along an air gap 40, assuming that the external electric field is such that it accelerates electrons in a manner that they travel in a direction from the top of the light pipe assembly 20 downwardly towards the cup-shaped structure, more particularly from point D to point E. The spark cannot directly jump from A' to G, as it is blocked by any suitable spark blocking member, such as a plastic member, e.g., the plastic feature 16*p* illustrated in FIG. 1B and in FIG. 3B. Because the spark or discharge path follows the electric field down along the side of the light pipe assembly 20, the external field will accelerate the electrons. Upon reaching point E on the bottom of the cup-shaped structure (i.e. the bottom of recess 24) the electrons must then travel generally normal to the light pipe assembly 20, more specifically the electrons must travel from point E to point F, a direction approximately perpendicular to the driving electric field established between the top and the bottom of the light pipe assembly 20. Subsequent to traveling the horizontal distance from point E to point F along the bottom of the recess 24 of the cup-shaped structure, the charge of electrons must then travel from point F to point G, or in an upward direction generally parallel to the electric field and in a direction which is essentially opposite to that of the electron's natural movement in a static field. Stated alternatively, after traveling from point E to point F along the bottom of recess 24 of the cup-shaped structure or the body 22, the electrons turn in a normal or perpendicular direction and travel upwardly, away from the bottom of the cup-shaped structure and in a path generally parallel to the axis of the bore 34 in the light pipe assembly 20. Thus, the external field can not easily create any additional charge carriers along that path, nor can it accelerate charge carriers in the direction from point F to point G. The electrical breakdown process between point F and point G must be either caused by an additional electron based breakdown going from point G to point F, or by the accumulation of charge carriers inside the air gap 40 to a level which is large enough to disturb the external field until the field direction from point F to point G reverses, or by ion-based processes. In any case, an increase in the length between point F and point G will increase much more the voltage needed to achieve a breakdown than or when compared to a situation in which the spark from electrostatic discharge needs to travel an equivalent linear distance, but in a direction such that the external field is driving the spark, not hindering the spark from electrostatic discharge travel.

In another embodiment of the present invention, the bore 34 formed in the light pipe assembly 20 provides electrostatic immunity protection for the static sensitive device 20 by increasing the voltage required for an electrical breakdown. The bore 34 provides additional electrostatic immunity protection in addition to the protection provided by the field resistive path provided by the cup-shaped structure or body 20 including recess 24 of light pipe assembly 20. More specifically and as previously indicated, the bore 34 will change the field structure, due to charges accumulated in the bottom of the bore, in such a way that the outside path (through the gap) will resist breakdown from an increased voltage.

Upon reaching the threshold of air ionization, the electric field creates charged particles (i.e., electrons and ions) and the charged particles move to the bottom of the bore 34 as a result of the static e-field. The recently created and relocated charged particles on the bottom of the cylindrical hole of bore 34, along with their closer proximity, create an "intensified" e-field between themselves and the printed circuit board 22a. The resulting region of increased e-field strength reduces the remaining strength of the static e-field that was originally set up between the electrostatic charged object 18 and the printed circuit board 22a.

Figure 9B:
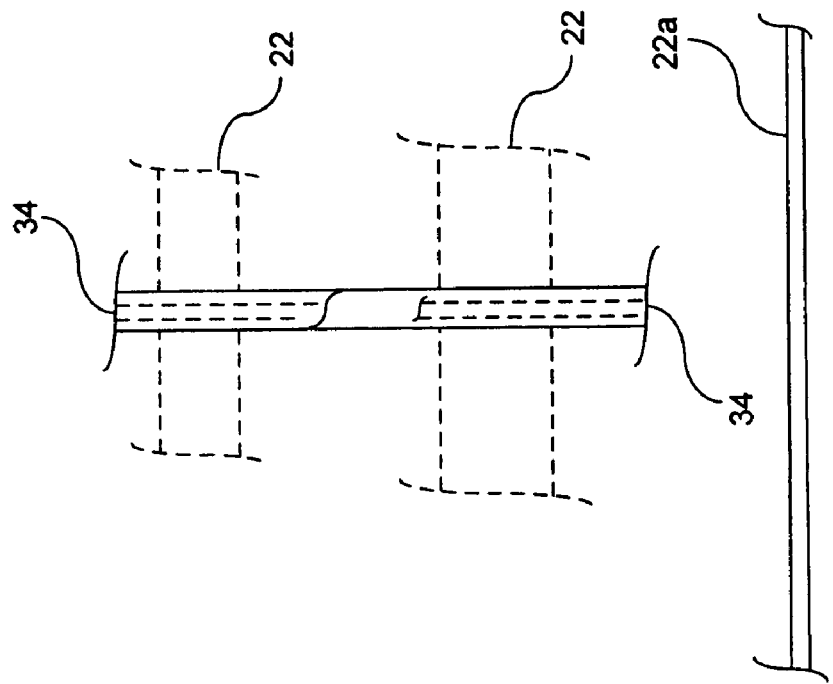
FIG. 9B is a side elevational view of another embodiment of the light pipe assembly coupled to a product case and representing dual opposed devices with opening of one bore facing the circuit board and the opening of the opposed bore facing away from the circuit board as illustrated in FIGS. 1A, 1B, and 2–4.
Figure 9A:
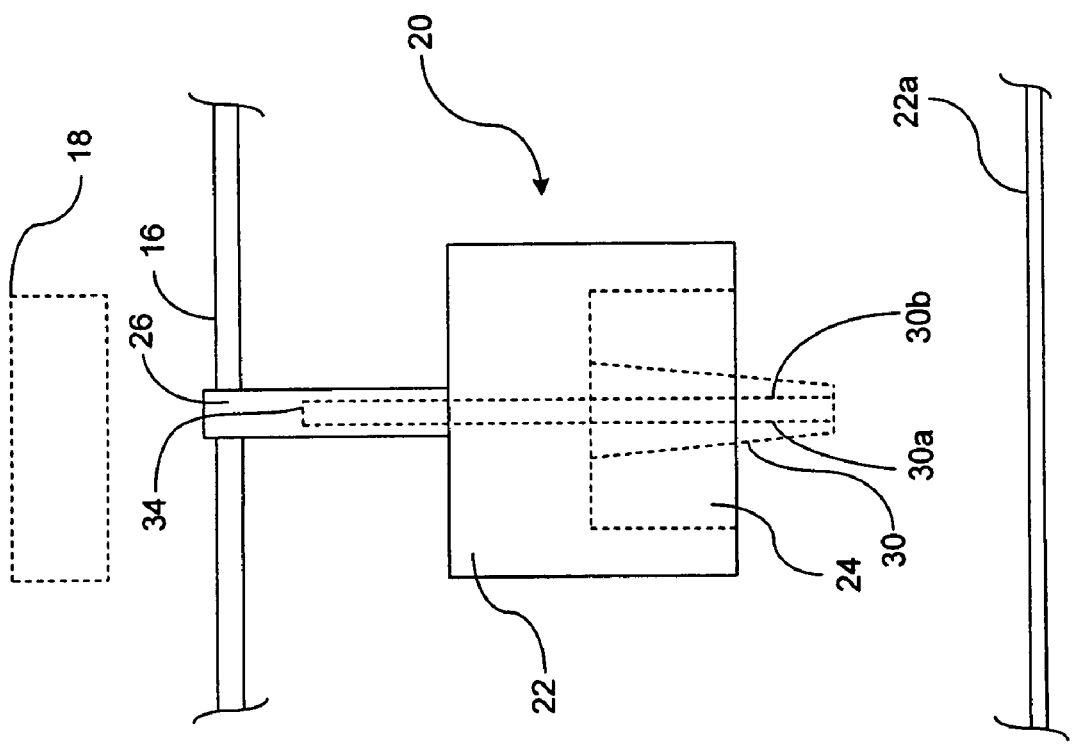
FIG. 9A is a side elevational view of an embodiment of the light pipe assembly coupled to a product case and disposed such that the commencement of the opening of the bore faces and is in proximity to a circuit board.
Figure 11:
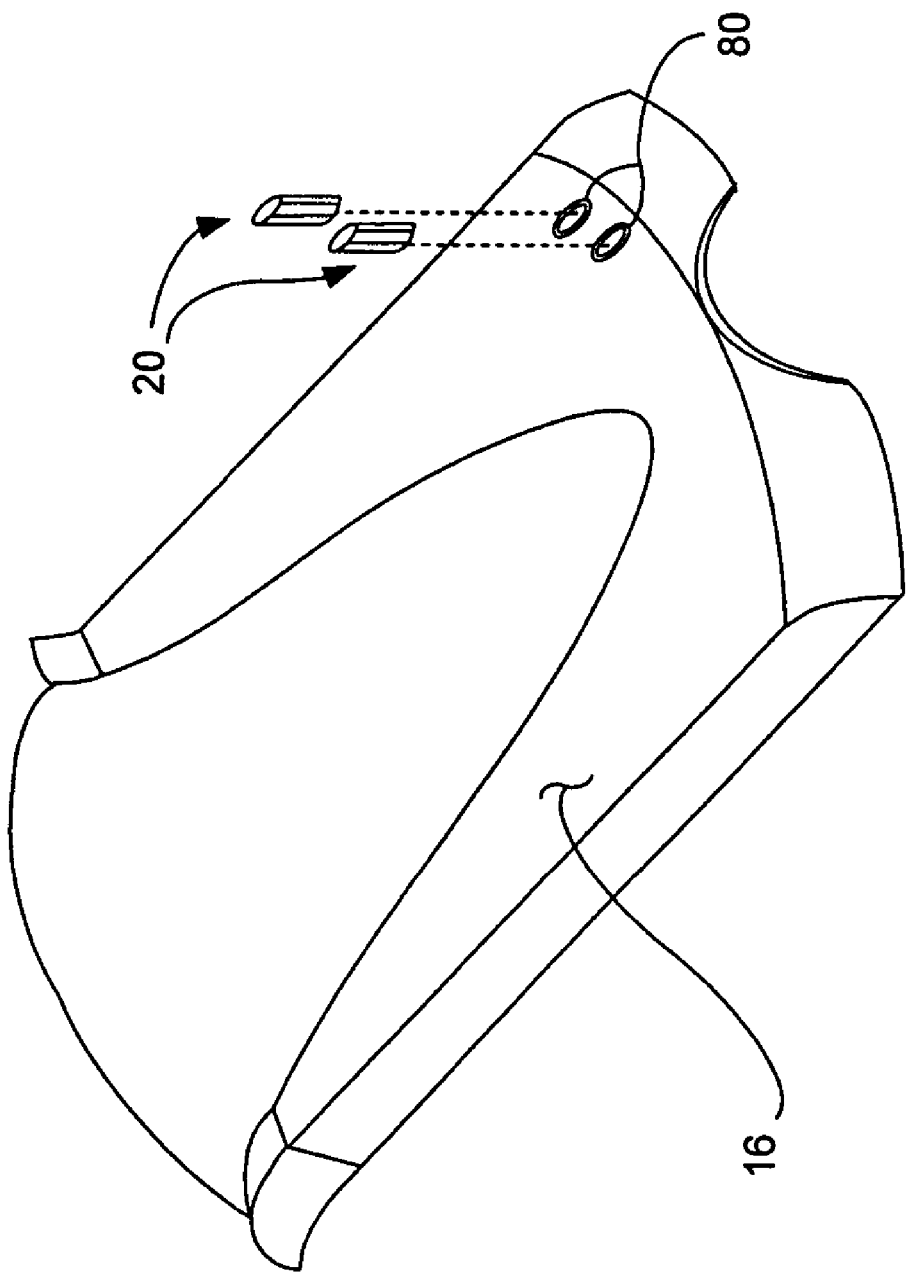
FIG. 11 is a perspective view of the case of FIG. 10 having a pair of light pipe assemblies displaced from the case.
Figure 13:
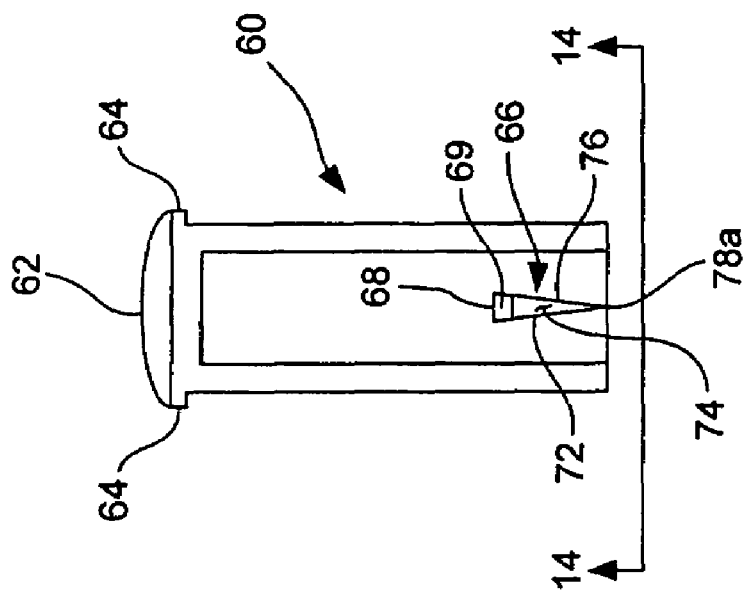
FIG. 13 is a side elevational view of the embodiment of the light pipe assembly of FIG. 12.
Figure 12:
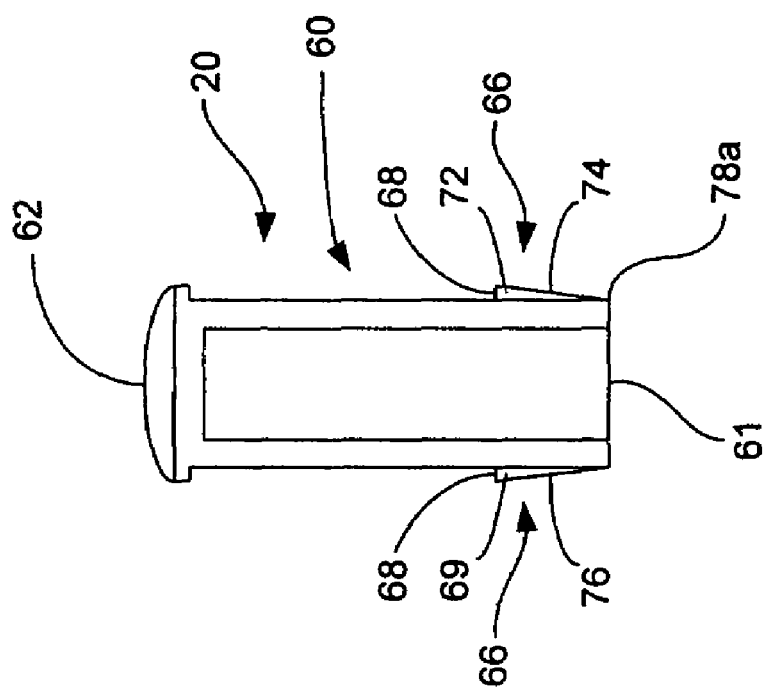
FIG. 12 is an end elevational view of an embodiment of the light pipe assembly of FIGS. 10 and 11.
Figure 14:
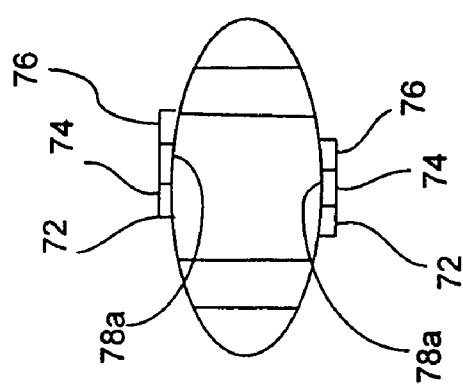
FIG. 14 is a bottom plan view of the light pipe assembly taken in direction of the arrows and along the plane of line 14—14 in FIG. 13.
Figure 15:
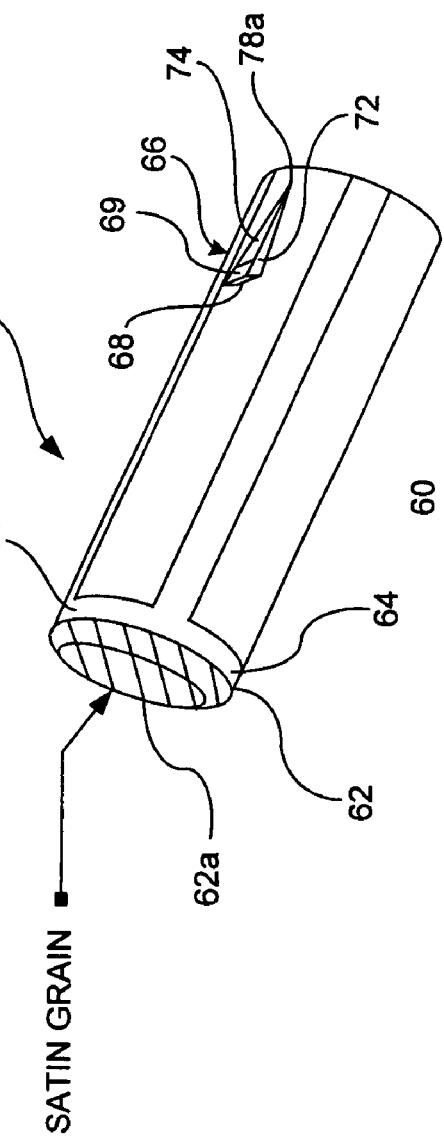
FIG. 15 is a perspective view of the light pipe assembly of FIGS. 12–14.
Figure 16:
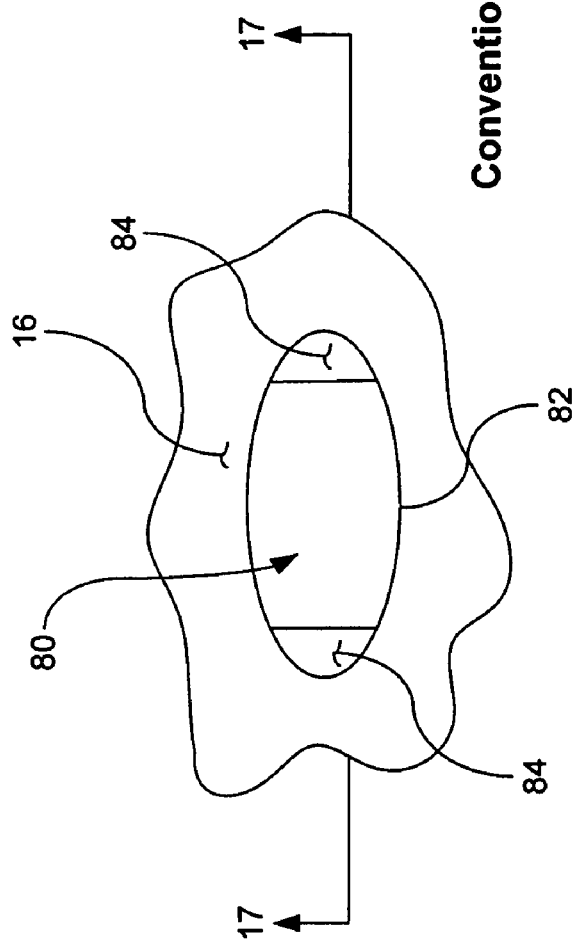
FIG. 16 is a top plan view of an opening in a case member where the light pipe assembly of FIGS. 12–15 may be disposed.
Figure 17:
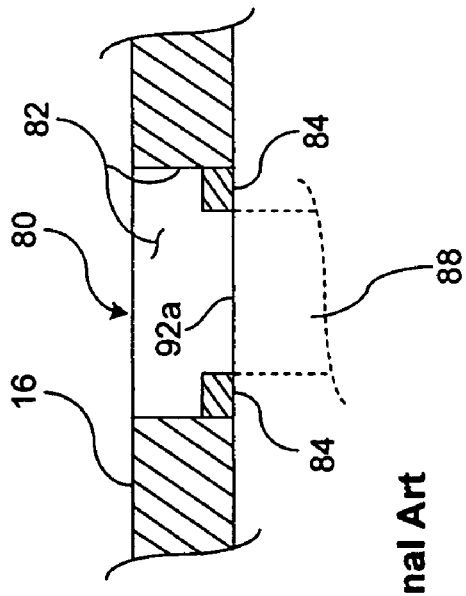
FIG. 17 is a vertical sectional view taken in direction of the arrows and along the plane of line 17—17 in FIG. 16.
Figure 20:
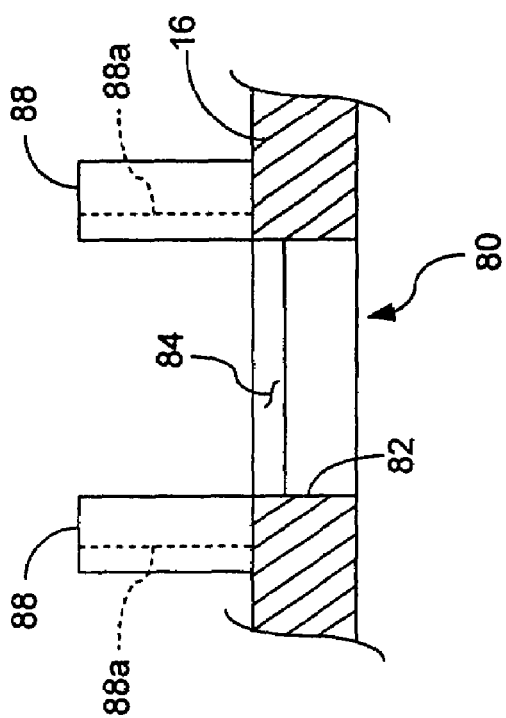
FIG. 20 is a vertical sectional view taken in direction of the arrows and along the plane of line 20—20 in FIG. 18.
Figure 21:
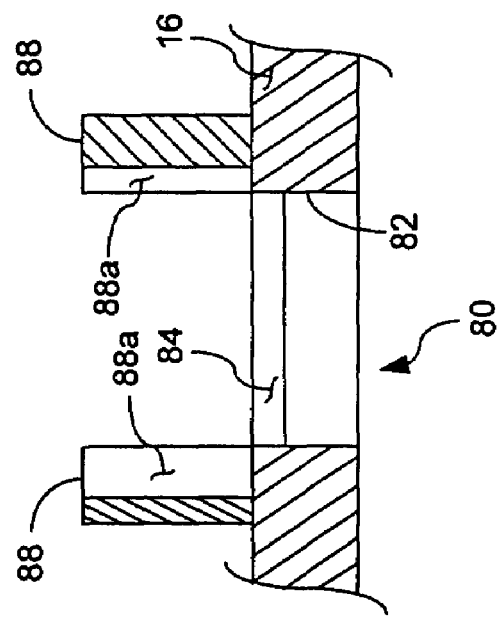
FIG. 21 is a vertical sectional view taken in direction of the arrows and along the plane of line 21—21 in FIG. 18.
Figure 22:
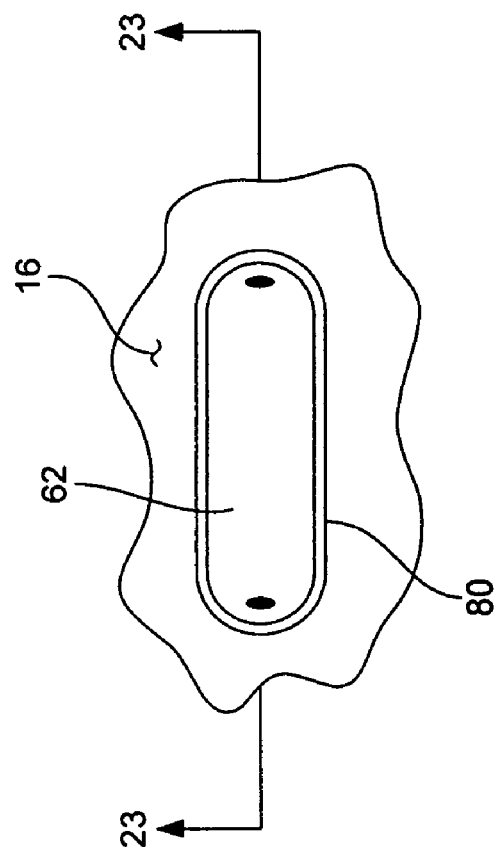
FIG. 22 is a top plan view of the opening in the case member illustrated in FIG. 16 with the light pipe assembly of FIGS. 12–15 disposed therein.

As previously indicated, the field reduction aperture or bore 34 may be implemented in the reverse orientation where corona charges are created in proximity of the printed circuit board 22a and then accelerated upwards towards the object 18 that has caused a resulting e-field in an "opposite" direction. The aperture or bore 34 would then be oriented in the reverse direction as illustrated in FIG. 9A. More specifically, the bore 34 would be postured or implemented such that the aperture or bore 34 is open in proximity to the printed circuit board 22a and distally closed from the printed circuit board 22a. Additionally, in considering this reverse configuration, it is expected that charged particles, accelerating from the printed circuit board 22a towards the top of the light pipe assembly 20, will come to rest on the inside surface of the plastic case 16 and cause an identical "intensified" e-field which again would contribute to the reduction of the overall e-field strength and decrease in the likelihood of a discharge event. In FIG. 9B there is broadly illustrated a combination of the embodiment of the light pipe assembly in FIG. 9A and the embodiment in FIGS. 1A, 1B and 2–4. More specifically, FIG. 9B is a side elevational view of another embodiment of the light pipe assembly coupled to a product case and representing dual opposed devices with the opening of one bore, as illustrated in FIG. 9A, facing the circuit board, and the opening of an opposed bore facing away from the circuit board, as illustrated in FIGS. 1A, 1B, and 2–4.

The field resistive light pipe assembly 20 for embodiments of the present invention may be manufactured in any suitable manner and with any suitable materials, such as with plastic (e.g., polyethylene, polypropylene, etc.) using an injection molding machine. The field resistive light pipe assembly 20 may be constructed by merging a straight section of light pipe (e.g. the combination of the head 30 and the leg 26) with a piece of plastic that has a generally cup-shaped geometric configuration (e.g. the body 22 plus recess 24).

As previously indicated, the bore 34 is located in the top (.i.e., the head 30) of the light pipe where it continues along the longitudinal axis of the main light pipe straight section. In an embodiment of the invention, the hole or bore 34 does not extend entirely through the entire length of the light pipe. Stated alternatively, the aperture or bore 34 terminates in the lower structural portion (e.g., the leg 26) of the light pipe assembly 20. In an embodiment of the invention, the bore 34 extends longitudinally through the length of the entire structure of the light pipe assembly 20. The bore may extend more than 50% but less than 100% of the length of the entire structure (e.g., the combination of the head 30 and the leg 26) of the light pipe assembly 20, preferably from about 60% to less than 100%, more preferably from about 75% to less than 100%, and most preferably from about 90% to less than 100%, of the length of the entire structure of the light pipe assembly 20. It is to be understood that this field reduction bore feature for embodiments of the present invention may be constructed in reverse orientation for providing enhanced discharge threshold protection for cases of e-fields of opposite polarity.

Referring now to FIGS. 10–24 for conventional art light pipe assemblies, there is seen the case assembly 10 having light pipe assembly 21. As illustrated in FIGS. 10–24, the light pipe assembly 21 includes a body 60 having a base 61 and a head 62 with a pair of opposed lips 64—64. The light pipe assembly 21 for the body of the invention illustrated in FIGS. 10–24 also includes a pair of ears or lugs, each generally illustrated as 66. Each of the lugs 66 has a lug head 68, a lug face 69, and a lug body 70 comprising sloping surfaces (e.g., inwardly sloping surfaces 72 and 76 and downwardly sloping surface 74) terminating in a lug base 78. The lug base 78 may be defined by a point 78a which may be generally co-planar with the base 61. The light pipe assembly 21 (as well as light pipe assembly 20) may be formed or manufactured from any suitable material, such as a transparent polycarbonate sold by General Electric under the product or trade name GE Lexan. The head 62 may be coated with, or manufactured from, any suitable material for confining at least some of light rays emanating from a source (e.g., an LED), such as by way of example only, a generally semi-opaque material or coating 62a (e.g., satin grain).

Figure 23:
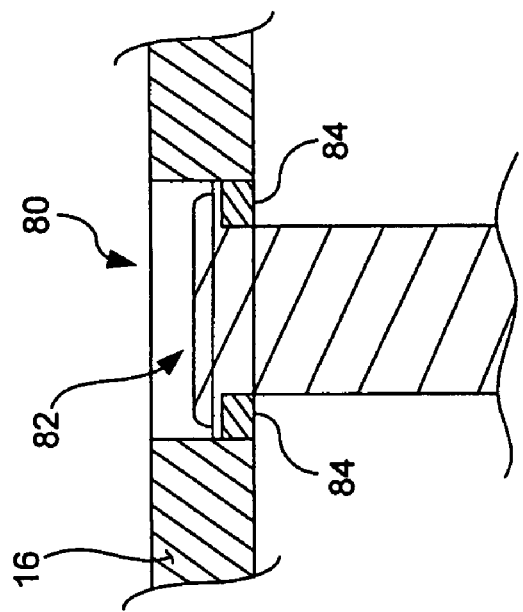
FIG. 23 is a vertical sectional view taken in direction of the arrows and along the plane of line 23—23 in FIG. 22.
Figure 24:
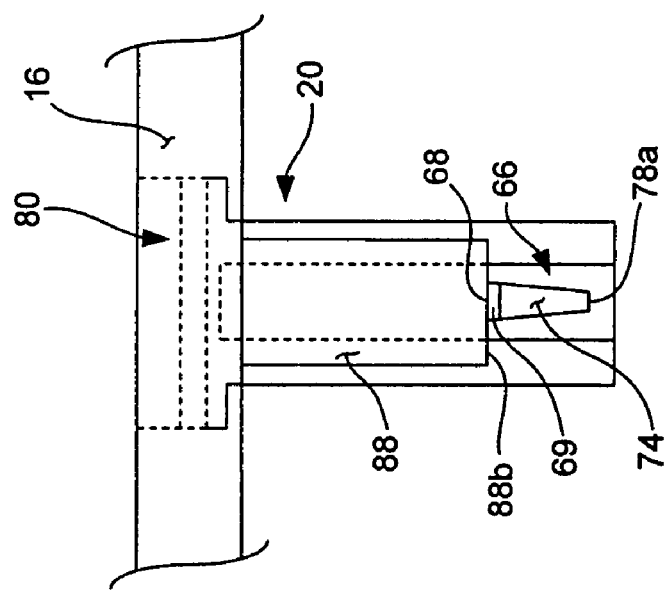
FIG. 24 is a side elevational view of the case member having the opening of FIGS. 16–23 with the light pipe assembly of FIGS. 12–15 disposed therein and shown retained and engaged by an engager or retainer.

The plastic case 16 for engaging the light pipe assembly 21 of FIGS. 12–15 comprises an opening, generally illustrated as 80 (see FIGS. 16–24). Opening 80 may have a boundary defined by wall 82 which may possess any suitable geometric shape, such as the geometric shape (e.g., generally oval) of the head 62 of the light pipe assembly 20 of FIGS. 12–15. Conveniently bound or connected to the wall 82 is a pair of opposed ledges 84—84 for engaging the lips 64—64 of the head 62 of the light pipe assembly 21 to support and maintain the light pipe assembly 21, more specifically the head 62, within the opening 80, as best shown in FIGS. 23 and 24. Disposed along and generally aligned with opposed perimeters 92a—92a are opposed light-pipe engagers and/or retainers and/or stabilizers 88—88 which project downwardly from around the opening 80 (i.e., from opposed perimeters 92a—92a). Each of the stabilizers 88 includes an arcuate surface 88a and a bottom end or edge 88b that slips over a respective lug face 69 and contacts (e.g., biasedly contacts) and/or lodges against the surface of a respective lug head 68, as illustrated in FIG. 24.

Referring now to FIGS. 25–31, there is illustrated another conventional art light pipe assembly, generally illustrated as 110. This embodiment of the light pipe assembly 110 includes a body 114, which may be a planar, generally rectangular body as illustrated in FIGS. 25–31. The light pipe assembly 110 additionally includes an opening (e.g., a longitudinal opening) 118, a pair of top lenses 122—122 for disseminating and/or emitting light from an LED, and a pair of bottom lenses 126—126 optically communicating with the top lenses 122—122 and receiving light from an LED. The top lenses 122—122 may be any suitable shape, such as the triangular shape illustrated in FIGS. 26 and 27 and having sloping surfaces 122a and 122b. The bottom lenses 126 each terminate in a generally arcuate, or generally semi-circular exterior surface 126a.

Figure 25:
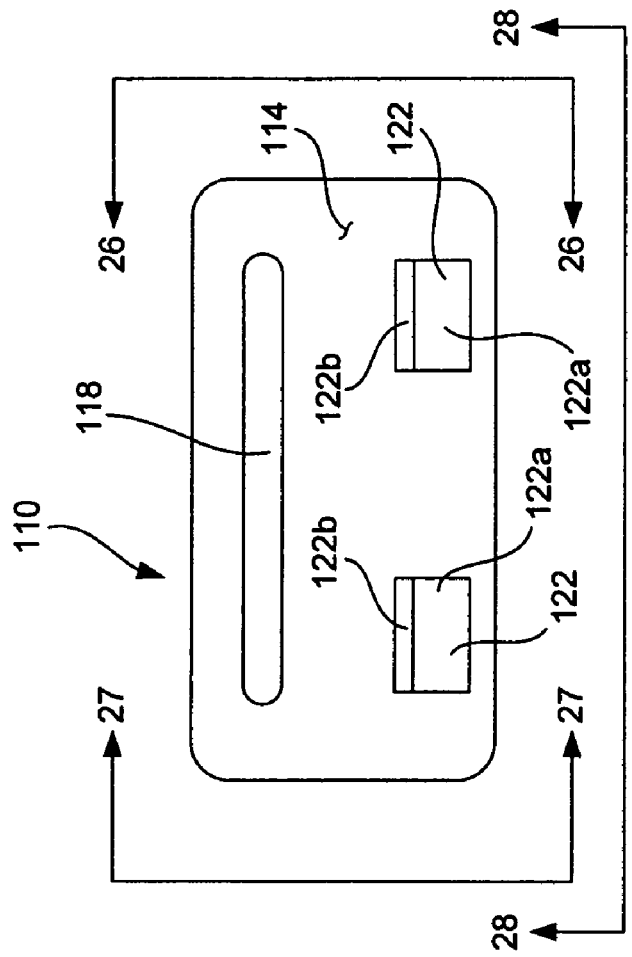
FIG. 25 is a top plan view of another conventional art light pipe assembly.
Figure 27:
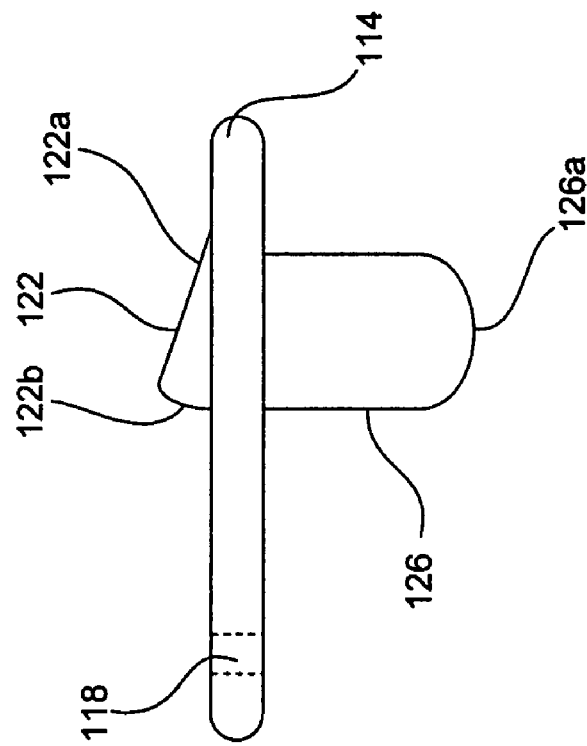
FIG. 27 is an end elevational view taken in direction of the arrows and along the plane of line 27—27 in FIG. 25.
Figure 26:
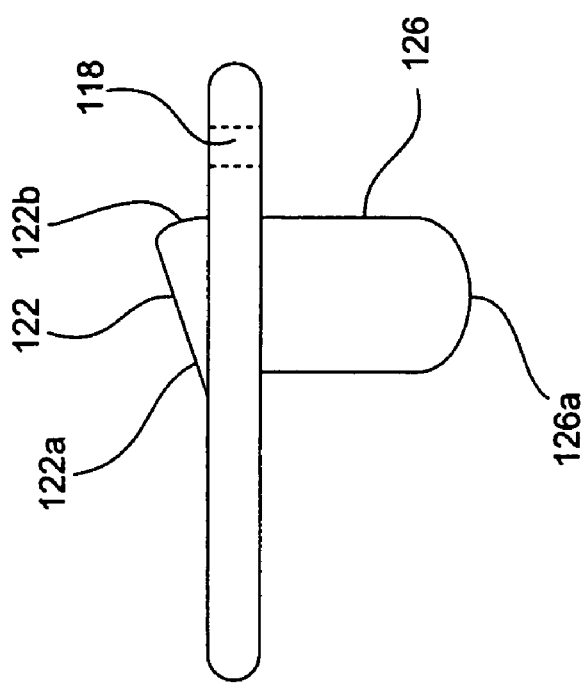
FIG. 26 is an end elevational view taken in direction of the arrows and along the plane of line 26—26 in FIG. 25.
Figure 31:
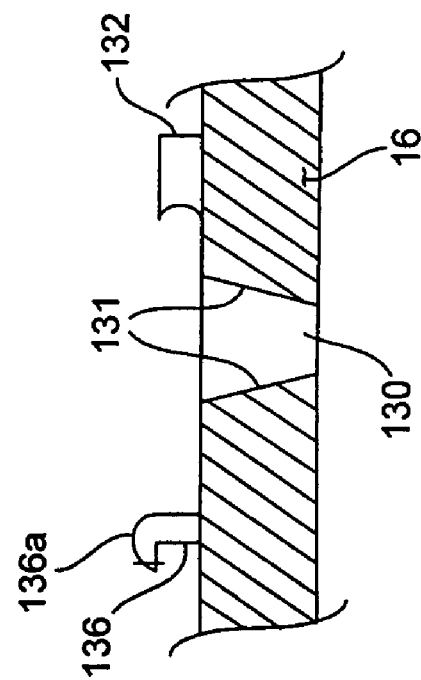
FIG. 31 is a vertical sectional view taken in direction of the arrows and along the plane of line 31—31 in FIG. 29.
Figure 30:
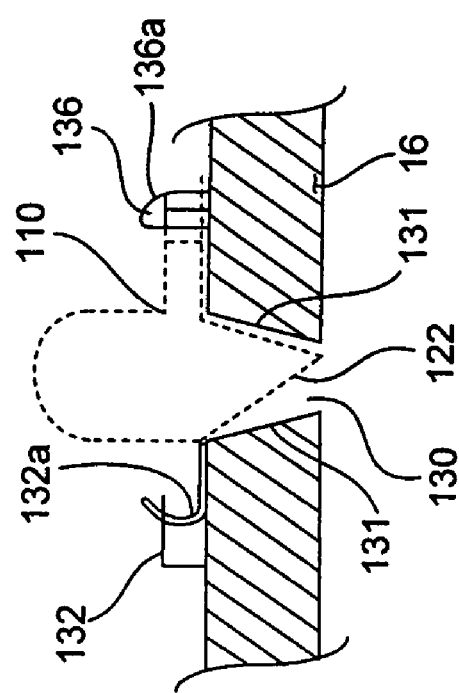
FIG. 30 is a vertical sectional view taken in direction of the arrows and along the plane of line 30—30 in FIG. 29.

The light pipe assembly 110 of FIGS. 25–27 may be retained by, or coupled to, the case 16 by any suitable means. The case 16 is formed with a pair of apertures 130-130, retainers 132-132-132, and a coupler 136. Each aperture 130 has a pair of sloping opposed walls 131—131. Each retainer 132 has a concave wall 132a, and the coupler (or lug) 136 has a lip 136a. As shown by the dashed line representation of the light pipe assembly 110 in FIGS. 29 and 30, the light pipe assembly 110 is coupled to and/or positioned against the case 16 as follows: (i)top lenses 122 respectively lodge in respective apertures 130 (see FIG. 30); (ii)coupler 136 passes through opening 118 with the lip 136a overlapping a structural part of the body 114; and (iii)an edge of the body 114 lodges within the concave wall 132a of each of the retainers 132.

Figure 32:
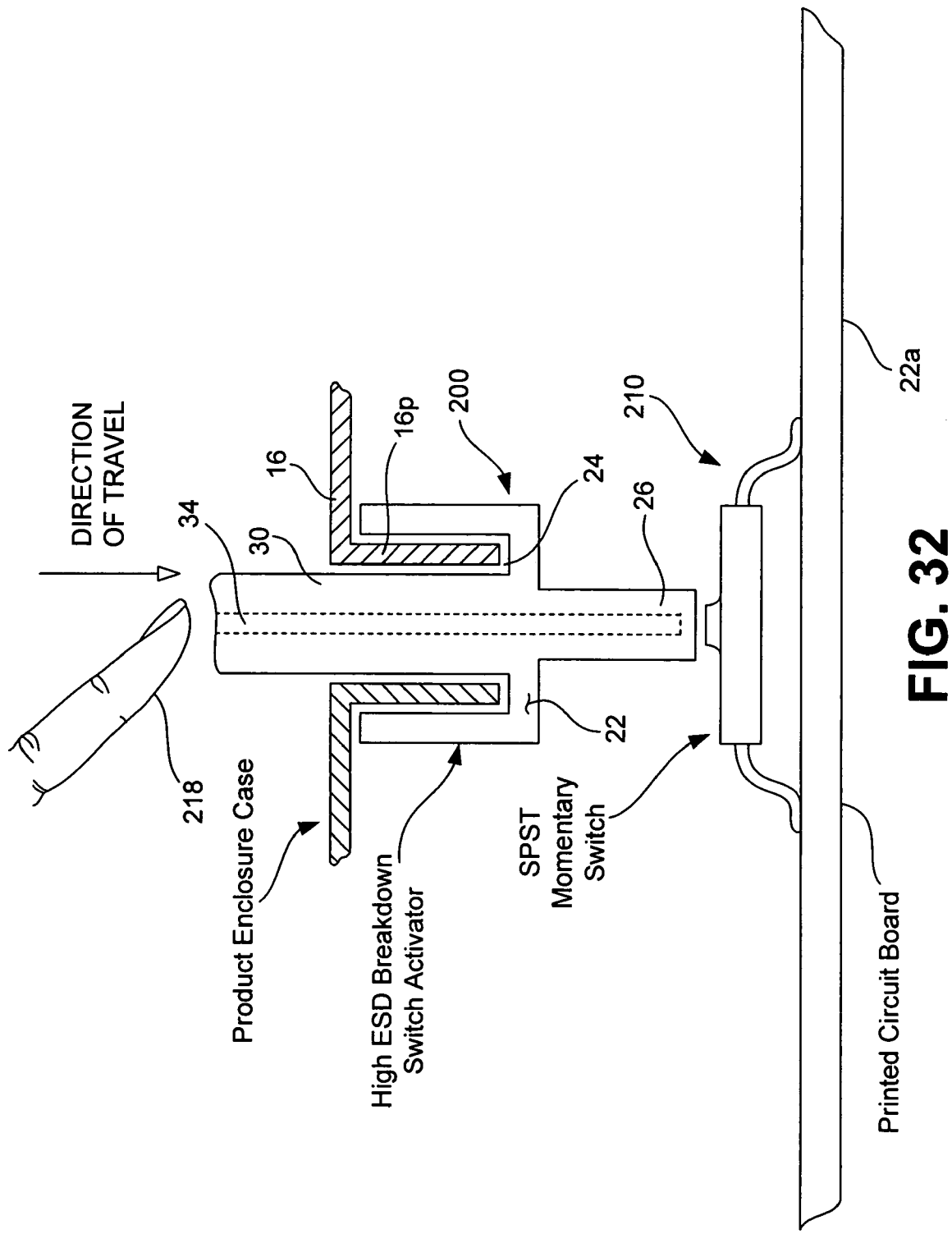
FIG. 32 is a side elevational view of a switch actuator assembly coupled to a product case and disposed for activating a switch supported by a circuit board, while simultaneously being capable of changing a direction of an electrostatic discharge to protect the circuit board including any of its associated parts.

Referring now to FIG. 32, there is seen at least part of the structure of the light pipe assembly 14 functioning as a switch actuator assembly, generally illustrated as 200. More specifically, FIG. 32 is a side elevational view of the switch actuator assembly 200 coupled to the product case 10 and disposed for activating a switch, generally illustrated as 210, supported by the circuit board 22a, while simultaneously being capable of changing a direction of an electrostatic discharge to protect the circuit board 22a including any of its associated parts. Also seen in FIG. 32 is the body 22 having the recess 24 to provide a structure for changing direction of an electrostatic discharge, such as one emanating from or caused by electrostatic charged object or finger 218. The switch actuator assembly 200 additionally includes the depending leg 26, bound to the body 22 and the generally projecting head 30. As constructed and in an embodiment of the invention, the switch actuator assembly 200 includes the bore 34 and the recessed-cup body 22 to cause higher environmental voltages to be required to cause a breakdown. The product case 16 and the switch actuator assembly 200 have tolerances that allow for movement between the product case 16 and the actuator assembly 200. As illustrated in FIG. 32, the actuator assembly 200 is free to move down towards switch 210 where the latter when pushed will be actuated. The switch 210 may be any element (not necessarily a switch) which is capable of being actuated when pushed by the actuator assembly 200, such as by way of example only, a single pole single throw, SPST, switch containing an internal spring for providing the force necessary to return the actuator assembly 200 to an "up" position as the switch is returned to its "non-actuated" position.

It is to be understood that the following objects fall within the spirit and scope of the present invention: electrical cords, water pipes, structural members or any other "functional objects" that is capable of passing through an opening in a case where one needs increased ESD immunity. Thus, embodiments of the present invention include an assembly and method for changing a direction of an electrostatic discharge comprising providing a structure having a path capable of passing an electrostatic discharge generated by an objected selected from the following group an electrical cord, a water pipe, a structural member or any other functional objects, and changing a direction of an electrostatic discharge (e.g., changing by over about 90°) passing through the path.

Therefore, by the practice of various embodiments of the present invention there is provided a field resistive light pipe structure having the advantage of being able to be constructed in a manner to achieve a higher voltage/charge immunity threshold in a smaller physical space. The employment of a perpendicular flat surface around the light pipe requires more area and may not be possible for some small products. The field resistive light pipe structure has the advantage of being a low cost solution for assembly labor based on simplicity. A simple press fit is capable of holding the light pipe securely, allowing the light pipe structure to be easily installed. No additional materials, such as glue, are required. Also, no elaborate tools, such as ultra-sonic welders, are required. There is no need to incur the increased costs involved with precision injection molding tooling.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims.

What is claimed is:

1. A method for changing a direction of an electrostatic discharge, the method comprising:
   providing a structure having a path capable of passing an electrostatic discharge, wherein the path comprises a seam for passing the electrostatic discharge;
   disposing a device in proximity to the path for changing the direction of the electrostatic discharge wherein said device comprises a light pipe including a recess for changing the direction of the electrostatic discharge and for receiving a blocking member that blocks the electrostatic discharge, wherein said device comprises a bore for increasing a breakdown voltage by changing a field structure; and
   changing by over 90° (ninety degrees) a direction of an electrostatic discharge passing through the path.

2. The method of claim 1 additionally comprising changing the direction of the electrostatic discharge away from a circuit board.

3. The method of claim 1 additionally comprising increasing a breakdown voltage by changing a field structure of the electrostatic discharge.

4. The method of claim 1 additionally comprising disposing the device in proximity to the path for changing the direction of the electrostatic discharge away from a circuit board.

5. The method of claim 1 wherein the device changes the direction of the electrostatic discharge by 180 degrees.

6. The method of claim 1 wherein said light pipe comprises said bore facing a circuit board.

7. The method of claim 1 wherein said recess receives said blocking member comprising a plastic member.

8. The method of claim 1 wherein said bore extends through a head, through a body, and terminates in a leg depending from the body.

9. A case assembly comprising:
   a case member comprising a seam for passing an electrostatic discharge; and a light pipe assembly coupled to said case member and capable of changing by over 90° (ninety degrees) a direction of the electrostatic discharge, wherein the light pipe includes a recess for changing the direction of the electrostatic discharge and for receiving a blocking member that blocks the electrostatic discharge, wherein said light pipe assembly comprises a body, a leg member coupled to and depending from the body, and a head supported by said body, and additionally comprises a bore extending into said head.

10. The case assembly of claim 9 additionally comprising a circuit board.

11. The case assembly of claim 9 wherein said body includes a structure defining the recess.

12. The case assembly of claim 9 additionally comprising said bore extending into said body.

13. The case assembly of claim 12 additionally comprising said bore extending into and terminating in said leg.

14. The case assembly of claim 12 wherein said bore includes a length generally greater than about 50% but less than 100% of a distance extending from the top of the head to the bottom of the leg.

15. The case assembly of claim 9, wherein the recess receives the blocking member comprising a plastic member.

16. A case assembly comprising: a case member including a seam for passing an electrostatic discharge; a switch actuator assembly coupled to the case member and capable of changing a direction of the electrostatic discharge, wherein the switch actuator assembly includes a recess for changing the direction of the electrostatic discharge and for receiving a blocking member that blocks the electrostatic discharge, wherein the switch actuator assembly includes a bore; and a circuit board supporting a member which is to be actuated by the switch actuator assembly.

17. The method of claim 16, wherein the recess receives the blocking member comprising a plastic member.

18. A method for changing a direction of an electrostatic discharge, the method comprising:

providing a structure having a path capable of passing an electrostatic discharge;

disposing a device in proximity to the path for changing the direction of the electrostatic discharge wherein said device comprises a light pipe defining a recess for changing the direction of the electrostatic discharge and for receiving a blocking member that blocks the electrostatic discharge, wherein said device comprises a bore for increasing a breakdown voltage by changing a field structure; and changing by over 90° (ninety degrees) a direction of an electrostatic discharge passing through the path.

19. The method of claim 18 additionally comprising changing the direction of the electrostatic discharge away from a circuit board.

20. The method of claim 18 additionally comprising increasing a breakdown voltage by changing a field structure of the electrostatic discharge.

21. The method of claim 18 additionally comprising disposing the device in proximity to the path for changing the direction of the electrostatic discharge away from a circuit board.

22. The method of claim 18 wherein said device changes the direction of the electrostatic discharge by 180 degrees.

23. The method of claim 18 wherein said light pipe comprises a bore facing a circuit board.

24. The method of claim 18 wherein said recess receives said blocking member comprising a plastic member.

25. The method of claim 18 wherein said bore extends through a head, through a body, and terminates in a leg depending from the body.

26. A case assembly comprising:

a case member; and a light pipe assembly coupled to said case member and capable of changing by over 90° (ninety degrees) a direction of an electrostatic discharge, wherein said light pipe assembly comprises a body including a recess for changing the direction of the electrostatic discharge and for receiving a blocking member that blocks the electrostatic discharge, a leg member coupled to and depending from the body, and a head supported by said body, and additionally comprising a bore extending into said head.

27. The case assembly of claim 26 additionally comprising a circuit board.

28. The case assembly of claim 26 additionally comprising said bore extending into said body.

29. The case assembly of claim 28 additionally comprising said bore extending into and terminating in said leg.

30. The case assembly of claim 28 wherein said bore includes a length generally greater than about 50% but less than 100% of a distance extending from the top of the head to the bottom of the leg.

31. The case assembly of claim 26, wherein the recess receives the blocking member comprising a plastic member.

32. A method for changing a direction of an electrostatic discharge, the method comprising:

providing a structure having a path capable of passing an electrostatic discharge;

disposing a device in proximity to the path for changing the direction of the electrostatic discharge wherein said device comprises a bore for increasing a breakdown voltage by changing a field structure; and changing by over 90° (ninety degrees) a direction of an electrostatic discharge passing through the path.

33. The method of claim 32 wherein said bore extends through a head, through a body, and terminates in a leg depending from the body.

34. A method for changing a direction of an electrostatic discharge, the method comprising:

providing a structure having a path capable of passing an electrostatic discharge;

disposing a device in proximity to the path for changing the direction of the electrostatic discharge wherein said device comprises a recess for changing the direction of the electrostatic discharge and for receiving a blocking member that blocks the electrostatic discharge, wherein said device comprises a bore; and changing by over 90° (ninety degrees) a direction of an electrostatic discharge passing through the path.

35. The method of claim 34, wherein the recess receives the blocking member comprising a plastic member.

* * * * *